(12) United States Patent
Chen et al.

(10) Patent No.: US 9,848,702 B2
(45) Date of Patent: Dec. 26, 2017

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Shih-Yen Kao, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 15/180,447

(22) Filed: Jun. 13, 2016

(65) Prior Publication Data

US 2017/0020024 A1    Jan. 19, 2017

(30) Foreign Application Priority Data

Jul. 15, 2015  (TW) .............................. 104123023 A

(51) Int. Cl.
| | | |
|---|---|---|
| *A47B 96/06* | (2006.01) | |
| *A47B 88/43* | (2017.01) | |
| *H05K 7/14* | (2006.01) | |

(52) U.S. Cl.
CPC ............ *A47B 96/067* (2013.01); *A47B 88/43* (2017.01); *H05K 7/1489* (2013.01)

(58) Field of Classification Search
CPC ...... H05K 7/1489; A47B 96/067; A47B 88/43
See application file for complete search history.

(56) References Cited

U.S. PATENT DOCUMENTS

| | | | | |
|---|---|---|---|---|
| 6,230,903 | B1 * | 5/2001 | Abbott .................. | A47B 88/43 211/190 |
| 6,557,960 | B2 * | 5/2003 | Shih ....................... | A47B 88/43 312/334.17 |
| 6,739,682 | B2 * | 5/2004 | Shih ........................ | H02B 1/36 312/223.1 |
| 6,773,080 | B2 * | 8/2004 | Chen ...................... | A47B 57/40 211/26 |
| 6,854,816 | B2 * | 2/2005 | Milligan ................ | A47B 88/43 312/334.11 |

(Continued)

FOREIGN PATENT DOCUMENTS

| | | | | |
|---|---|---|---|---|
| CA | 2431240 A1 * | 4/2003 | ............ | F16C 29/063 |
| EP | 2848158 A1 * | 3/2015 | ............. | A47B 88/43 |

(Continued)

*Primary Examiner* — Eret McNichols
(74) *Attorney, Agent, or Firm* — Rosenberg, Klein & Lee

(57) ABSTRACT

A slide rail assembly includes a first rail, a supporting member, and a second rail movably coupled to the first rail. The first rail defines a first channel. The supporting member includes a pair of supporting portions and a supporting wall that jointly define a supporting channel. The second rail corresponds to the first channel and the supporting channel. The supporting member is movable relative to the first rail from a first position to a second position, such that the second rail is supported by the supporting portions of the supporting member in the course of moving relative to the first rail.

15 Claims, 12 Drawing Sheets

(56) References Cited

U.S. PATENT DOCUMENTS

| | | | | |
|---|---|---|---|---|
| 6,860,574 B2 * | 3/2005 | Hwang | ............... | A47B 88/493 312/334.11 |
| 6,974,037 B2 * | 12/2005 | Haney | ............... | H05K 7/1421 211/183 |
| 7,481,504 B2 * | 1/2009 | Chen | ............... | A47B 88/427 312/330.1 |
| 7,552,899 B2 * | 6/2009 | Chen | ............... | A47B 88/43 211/26 |
| 7,740,329 B2 * | 6/2010 | Hsiung | ............... | H05K 7/1489 312/223.1 |
| 8,028,965 B2 * | 10/2011 | Chen | ............... | H05K 7/1489 248/298.1 |
| 8,147,011 B2 * | 4/2012 | Chen | ............... | F16C 29/04 312/333 |
| 8,366,217 B1 * | 2/2013 | Chen | ............... | A47B 88/43 312/333 |
| 8,371,454 B2 * | 2/2013 | Chen | ............... | H05K 7/1421 211/26 |
| 8,403,433 B2 * | 3/2013 | Chen | ............... | A47B 88/43 312/333 |
| 8,721,012 B2 * | 5/2014 | Chen | ............... | A47B 88/49 211/26 |
| 8,820,863 B2 * | 9/2014 | Chen | ............... | H05K 7/1489 312/334.5 |
| 8,967,744 B2 * | 3/2015 | Chen | ............... | H05K 7/1489 211/26 |
| 9,144,173 B2 * | 9/2015 | Chen | ............... | H05K 7/1489 |
| 9,313,914 B2 * | 4/2016 | Judge | ............... | H05K 7/1489 |
| 9,375,087 B1 * | 6/2016 | Chen | ............... | A47B 88/43 |
| 9,504,181 B2 * | 11/2016 | Chen | ............... | H05K 7/1489 |
| 2006/0152115 A1 * | 7/2006 | Dubon | ............... | A47B 88/43 312/334.8 |
| 2007/0018547 A1 * | 1/2007 | Yang | ............... | A47B 88/427 312/333 |
| 2008/0036347 A1 * | 2/2008 | Liang | ............... | A47B 88/40 312/334.5 |
| 2008/0073469 A1 * | 3/2008 | Mushan | ............... | A47B 88/43 248/205.1 |
| 2014/0265786 A1 * | 9/2014 | Chen | ............... | A47B 88/43 312/334.1 |
| 2016/0278234 A1 * | 9/2016 | Chen | ............... | H05K 7/1489 |

FOREIGN PATENT DOCUMENTS

| | | | | |
|---|---|---|---|---|
| EP | 2893838 A1 * | 7/2015 | ............ | H05K 7/1489 |
| EP | 2896324 A1 * | 7/2015 | ............ | H05K 7/1489 |

* cited by examiner

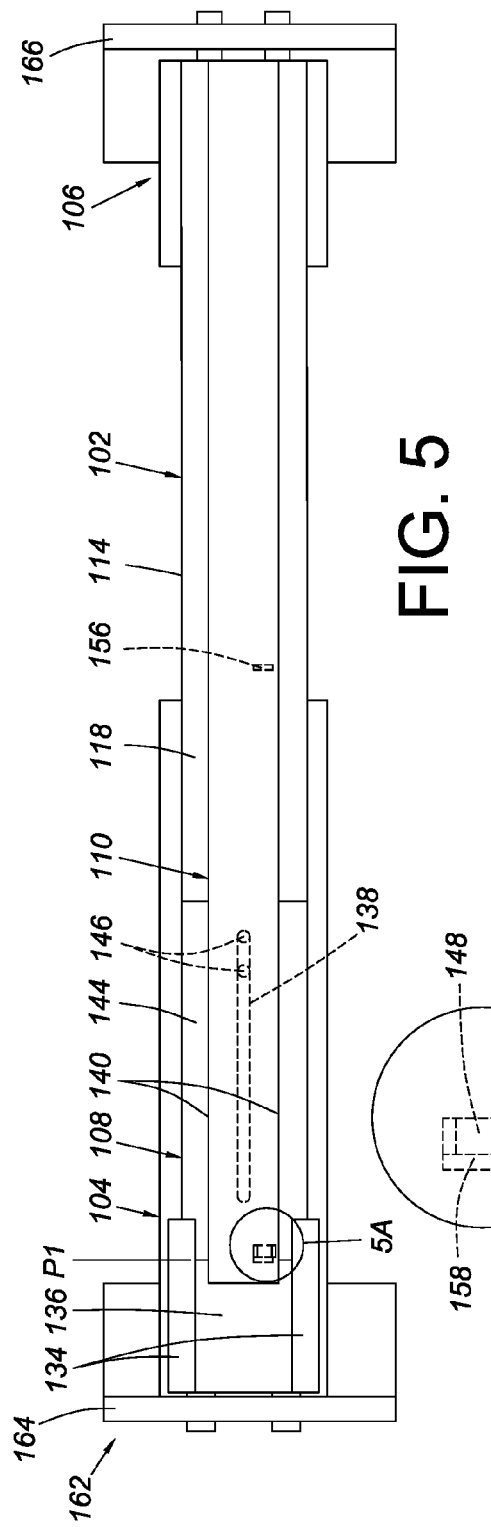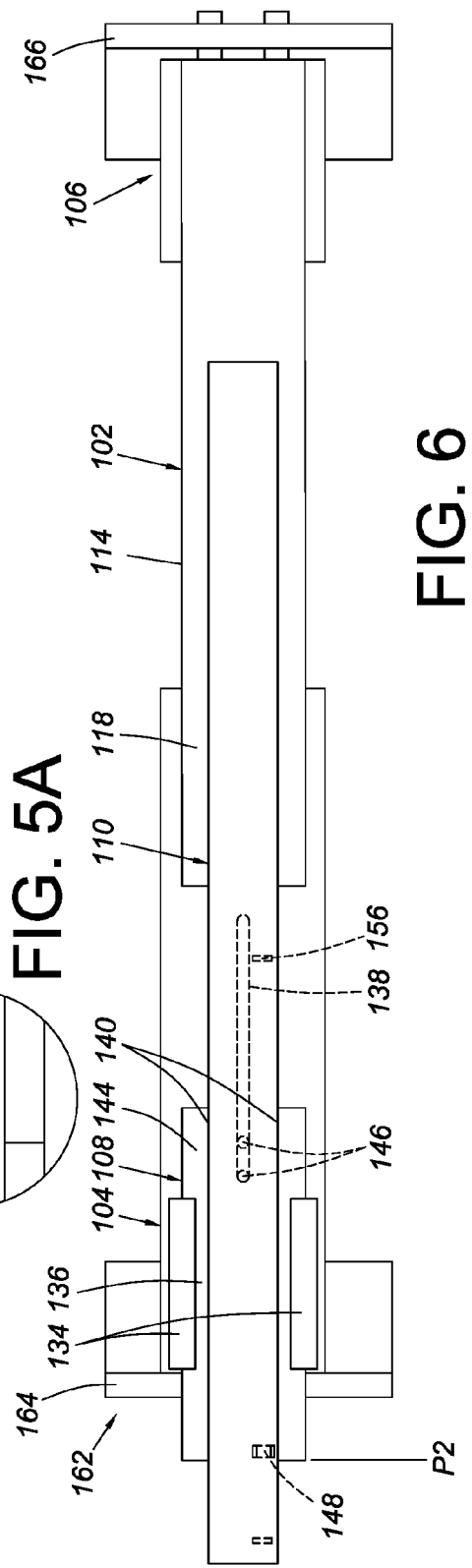

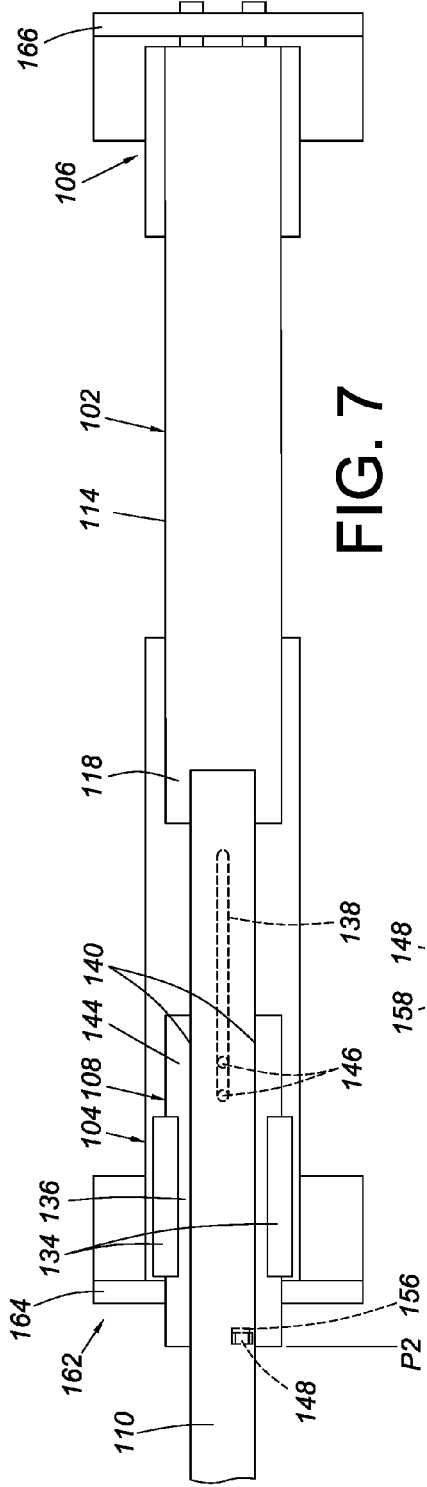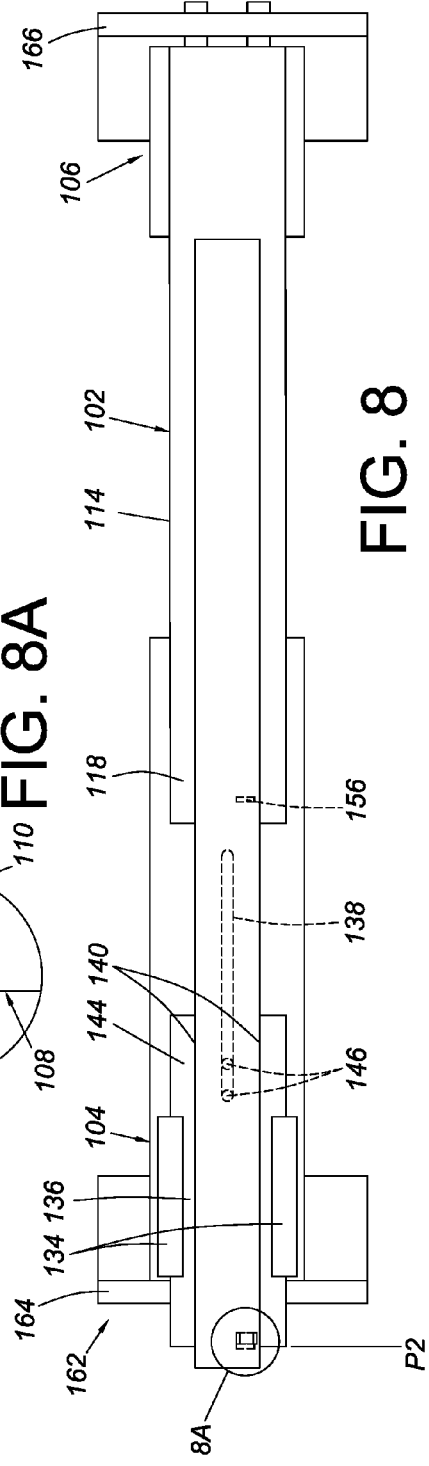

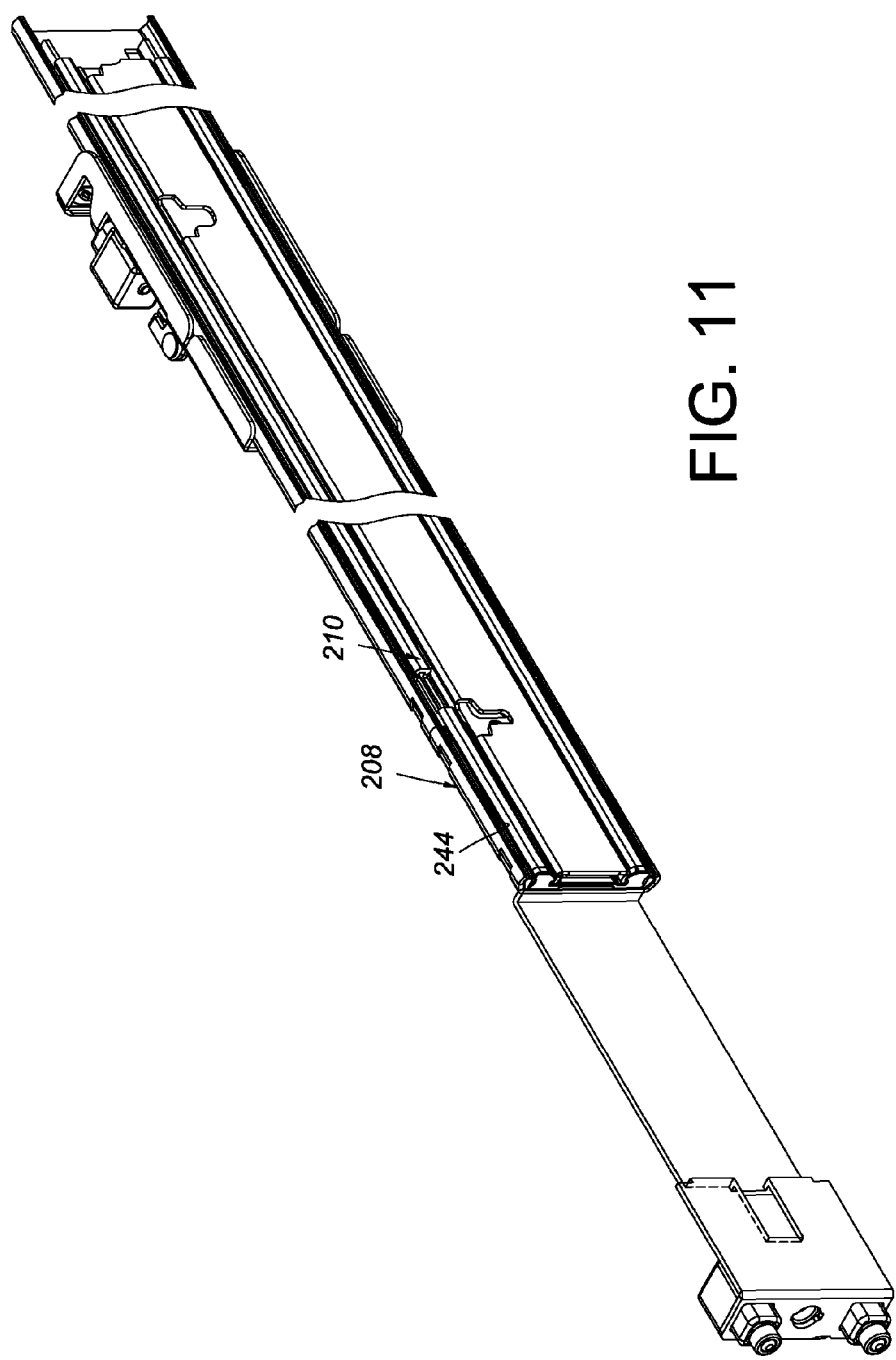

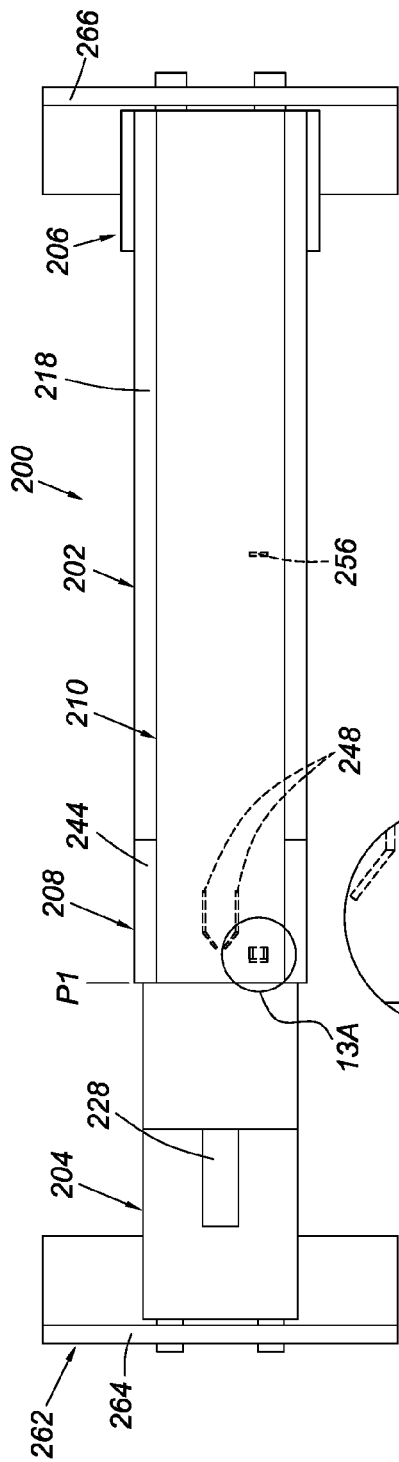
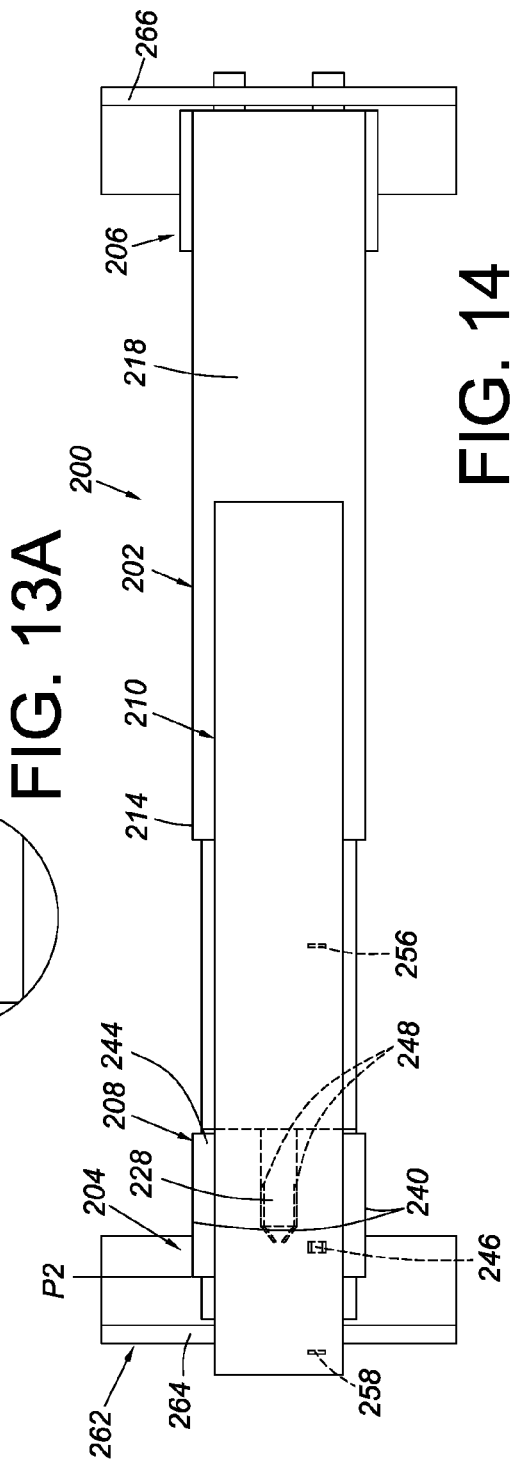

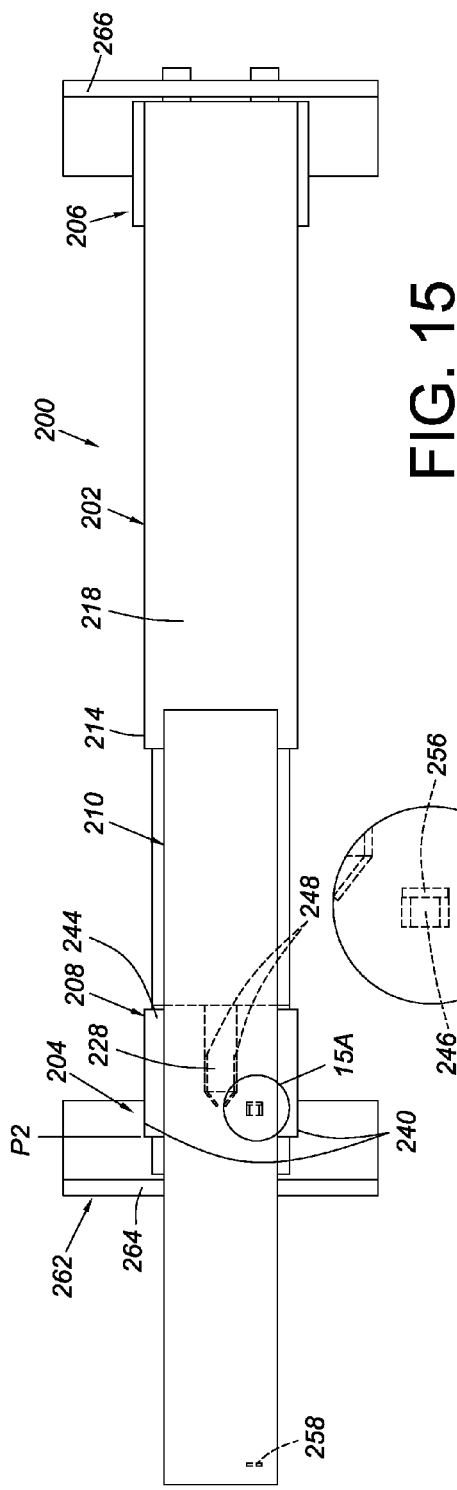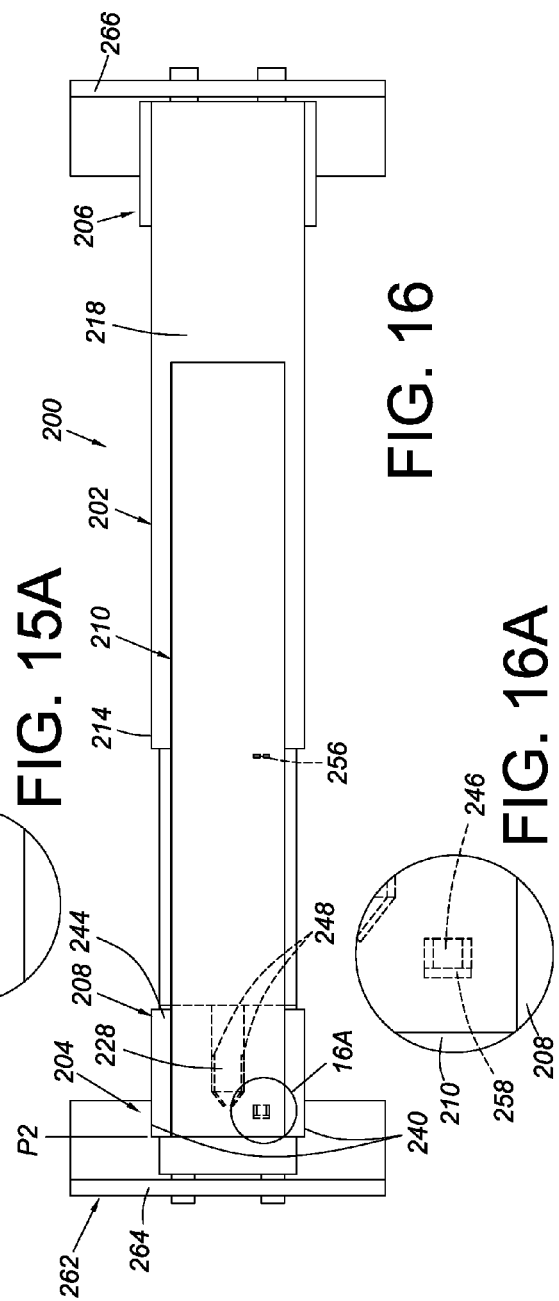

SLIDE RAIL ASSEMBLY

BACKGROUND OF THE INVENTION

Field of the Invention

The present invention relates to a slide rail assembly, more particularly to a slide rail assembly with enhanced support capacity.

Description of Prior Art

In a rack-mounted server system, a slide rail assembly is typically used to install electronic equipment chassis into a rack according to the standards of the Electronic Industries Association, so as to use the space in the rack effectively and facilitate centralized management and maintenance of equipment. However, as the weight of electronic equipment housed in a chassis increases recently due to increases of data usage, the slide rail assembly is required to carry heavier load in order for the chassis to be securely pulled out from the rack for maintenance. Thus the design of a slide rail assembly with enhanced support capacity presents an important task to the slide rail related industry.

A few examples of existing patents on rack-based server system including U.S. Pat. Nos. 6,181,549 B1, 6,230,903 B1, 6,305,556 B1, 6,424,534 B1, 6,601,713 B2, 6,655,534 B2, 7,350,884 B2, 8,287,059 B2 are incorporated herein for reference.

SUMMARY OF THE INVENTION

The primary object of the invention is to provide a slide rail assembly with enhanced support capacity.

In accordance with one aspect of the present invention, a slide rail assembly comprises a first rail, a supporting member, and a second rail. The first rail defines a first channel. The supporting member includes a pair of supporting portions and a supporting wall connected between the pair of supporting portions. The pair of supporting portions and the supporting wall jointly define a supporting channel. The second rail is movably coupled to the first rail and corresponds to the first channel of the first rail and the supporting channel of the supporting member. The supporting member is movable relative to the first rail from a first position to a second position, such that the second rail can be supported by the supporting portions of the supporting member when moving relative to the first rail.

Preferably, the slide rail assembly further comprises a first bracket mounted on the first rail at a position adjacent to the front-end portion of the first rail. The first bracket includes a side plate, an end plate substantially perpendicularly connected to the side plate, and a plurality of mounting members provided on the end plate. The side plate includes a first plate section, a second plate section, and a third plate section extending between the first plate section and the second plate section. The first plate section of the side plate is mounted on the first rail, and the second plate section of the side plate is adjacent to the end plate. The second plate section is provided with a pair of bracketing parts. The pair of bracketing parts jointly define an accessory channel that corresponds to the first channel of the first rail via the third plate section.

Preferably, the third plate section of the side plate is provided with an elongated hole where at least one connecting member partially passes through the elongated hole to connect to the supporting member such that the supporting member is movable relative to the first bracket.

Preferably the supporting wall of the supporting member has a contact feature and the second rail has a first feature and a second feature. The first feature of the second rail is situated posterior to the contact feature of the supporting member and the second feature of the second rail is situated anterior to the contact feature of the supporting member such that when the second rail is pulled out or pushed in over a predetermined distance relative to the first rail, the second rail is able to drive the supporting member to move.

Preferably the supporting wall of the supporting member has a latching feature and the first bracket has a guiding feature for the latching feature to move into it and be positioned therein temporarily.

BRIEF DESCRIPTION OF DRAWING

FIG. 5 is schematic view showing that the slide rail assembly according to the first embodiment of the present invention is installed on a rack;

FIG. 5A is a partially enlarged view of 5A in FIG. 5, illustrating that the second feature is situated anterior to the contact feature;

FIG. 6 is a schematic view showing that a supporting member of the slide rail assembly according to the first embodiment of the present invention is displaced to provide the second rail with support when the second rail is moved from inside the rack to outside the rack;

FIG. 7 is a schematic view showing that the second rail in FIG. 6 is moved further from inside the rack to outside the rack;

FIG. 8 is a schematic view showing that the second rail of the slide rail assembly according to the first embodiment of the present invention is in a retracted state relative to the first rail;

FIG. 8A is a partially enlarged view of 8A in FIG. 8, illustrating how the contact feature of the supporting member is propped against by the second feature of second rail;

FIG. 11 is an assembled view of the slide rail assembly according to the second embodiment of the present invention;

FIG. 13 is a schematic view of showing that the slide rail assembly according to the second embodiment of the present invention is installed on a rack;

FIG. 13A is a partially enlarged view of 13A in FIG. 13, illustrating that the second feature is situated anterior to the contact feature;

FIG. 14 is a schematic view showings that a supporting member of the slide rail assembly according to the second embodiment of the present invention is displaced to support the second rail when the second rail is moved from inside the rack to outside the rack;

FIG. 15 a schematic view showing that the second rail in FIG. 15 is moved further from inside the rack to outside the rack;

FIG. 15A is a partially enlarged view of 15A in FIG. 15, illustrating how the first feature props against the contact feature;

FIG. 16 is a schematic view showing that the second rail of the slide rail assembly according to the second embodiment of the present invention is in a retracted state relative to the first rail; and FIG. 16A is a partially enlarged view of 16A in FIG. 16, illustrating how the contact feature of the supporting member is propped against by the second feature of second rail.

DETAILED DESCRIPTION OF THE INVENTION

Figure 1:
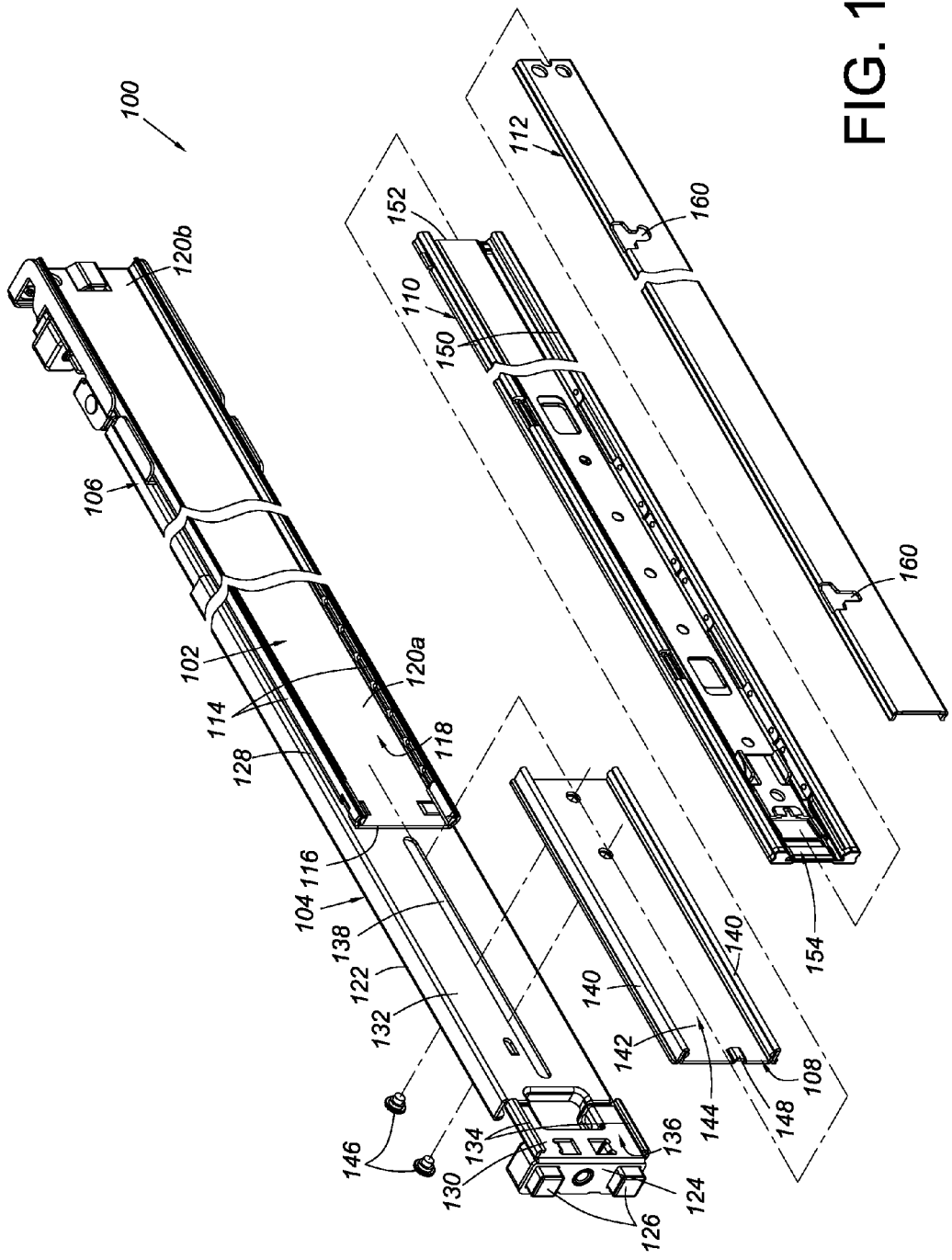
FIG. 1 is an exploded view of a slide rail assembly according to the first embodiment of the present invention.

Reference is made to FIG. 1 which is an exploded view of a slide rail assembly according to the first embodiment of the present invention. The slide rail assembly 100 comprises a first rail 102, a first bracket 104, a second bracket 106, a supporting member 108, a second rail 110, and a third rail 112.

The first rail 102 includes a pair of first sidewalls 114 and a first lateral wall 116 connected between the pair of first sidewalls 114. The pair of first sidewalls 114 and the first lateral wall 116 jointly define a first channel 118. The first lateral wall 116 has a front-end portion 120a and a rear-end portion 120b opposing the front-end portion 120a.

The first bracket 104 is mounted on the first rail 102 at a position adjacent to the front-end portion 120a of the first lateral wall 116. The first bracket 104 comprises a side plate 122, an end plate 124 and a plurality of mounting members 126. The side plate 122 includes a first plate section 128, a second plate section 130 and a third plate section 132 extending between the first plate section 128 and the second plate section 130. Specifically, the first plate section 128 of the side plate 122 is mounted on the first lateral wall 116 of first rail 102. The second plate section 130 of the side plate 122 is adjacent to the end plate 124 and provided with a pair of bracketing parts 134 jointly defining an accessory channel 136. The accessory channel 136 corresponds to the first channel 118 of the first rail 102 via the third plate section 132. The third plate section 132 of the side plate 122 is provided with an elongated hole 138. The end plate 124 is substantially perpendicularly connected to the side plate 122 with the plurality of mounting members 126 disposed thereon.

The second bracket 106 is mounted on the first rail 102 at a position adjacent to the rear-end portion 120b of the first lateral wall 116.

The supporting member 108 includes a pair of supporting portions 140 and a supporting wall 142 connected between the pair of supporting portions 140. The pair of supporting portions 140 and the supporting wall 142 jointly define a supporting channel 144. The supporting member 108 is movably mounted on the first bracket 104 where at least one connecting member 146, such as a pair of connecting members 146 may be used to partially pass through the elongated hole 138 of the side plate 122 to connect to the supporting wall 142 of the supporting member 108 such that the supporting member 108 is movable relative to the first bracket 104. In this embodiment, the supporting wall 142 of the supporting member 108 has a contact feature 148, such as a protruding part extending from the supporting wall 142.

Figure 2:
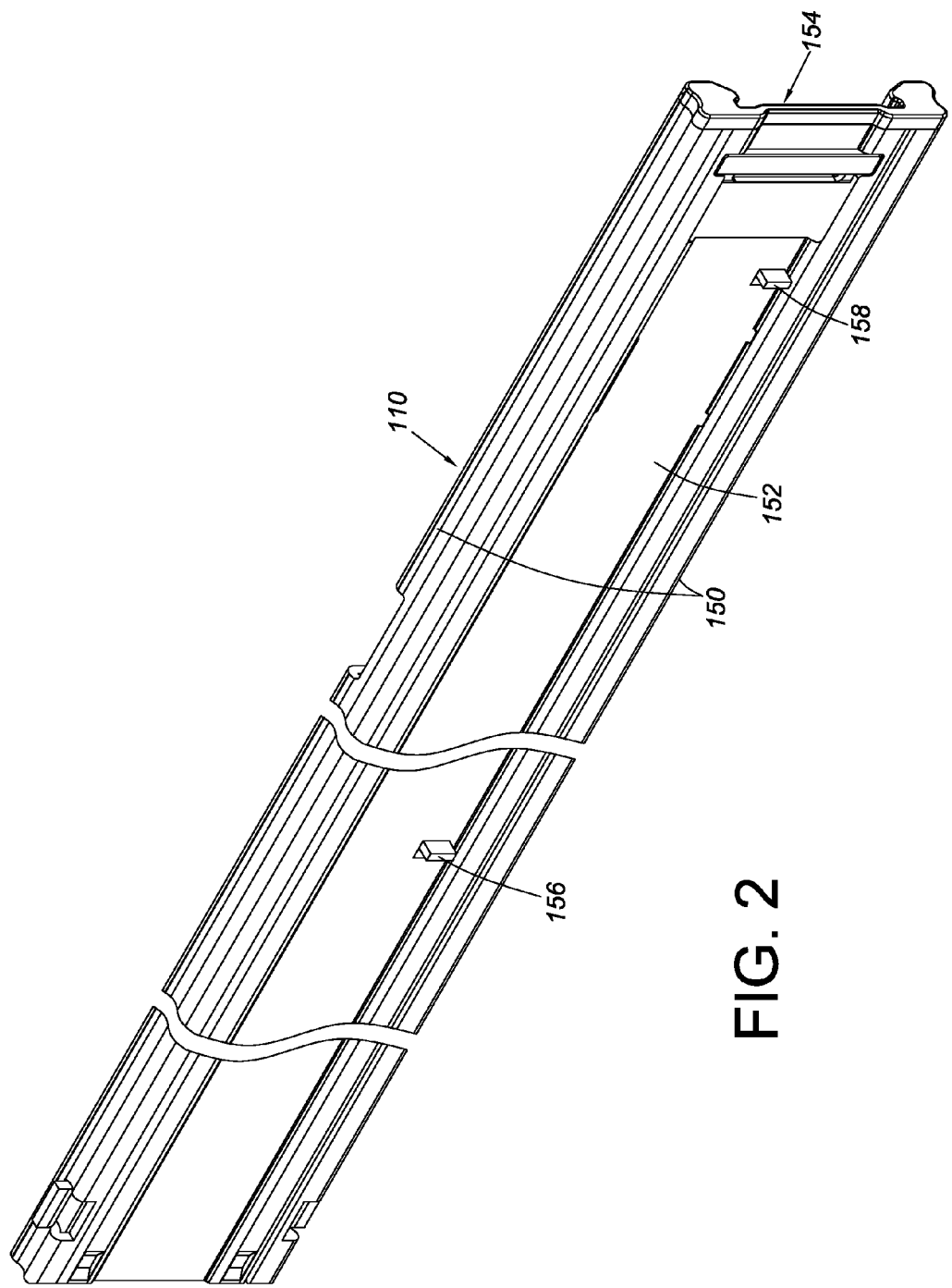
FIG. 2 is a schematic view of a second rail of the slide rail assembly according to the first embodiment of the present invention.

The second rail 110 is movably coupled to the first rail 102 and corresponds to the first channel 118 of the first rail 102 and the supporting channel 144 of the supporting member 102. As shown in FIG. 2, the second rail 110 includes a pair of second sidewalls 150 and a second lateral wall 152 connected between the pair of second sidewalls 150. The pair of second sidewalls 150 and the second lateral wall 152 jointly define a second channel 154. The second lateral wall 152 of the second rail 110 is further provided with a first feature 156 and a second feature 158 that are spaced a distance apart. An embodiment of the first feature 156 and the second feature 158 is respectively a protruding part extending from the second lateral wall 152 of the second rail 110.

Referring back to FIG. 1, the third rail 112 is movably coupled to the second rail 110 and corresponds to the second channel 154 of the second rail 110. The third rail 112 is provided with a plurality of mounting features 160 with the configuration of a concavity for an object, such as a chassis (not shown in the figure) to be hooked or mounted on the third rail 112.

Figure 3:
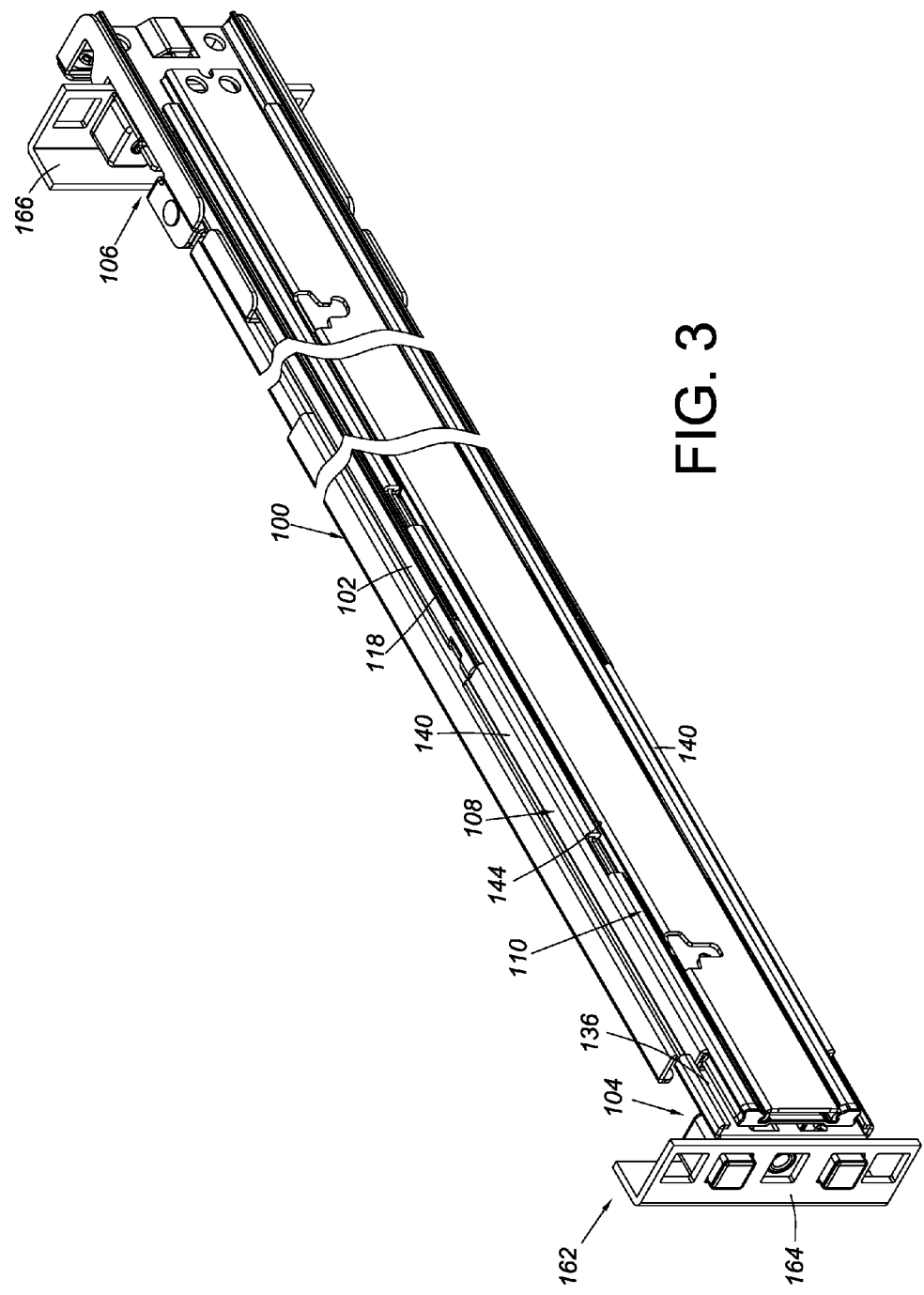
FIG. 3 is a perspective view showing that the slide rail assembly according to the first embodiment of the present invention is installed on a rack.

FIG. 3 shows the slide rail assembly 100 being mounted on a first post 164 of a rack 162 through the first bracket 104 at one end and on a second post 166 through the second bracket 106 at the other end so that the slide rail assembly 100 is securely mounted on the rack 162. When the slide rail assembly 100 is in a retracted state, the second rail 110 is situated inside the supporting channel 144 of the supporting member 108 and the first channel 118 of the first rail 102, and the supporting member 108 is partially situated inside the accessory channel 136 of the first bracket 104. Preferably the second rail 110 is in frictional contact with the supporting portions 140 of the supporting member 108.

Figure 4:
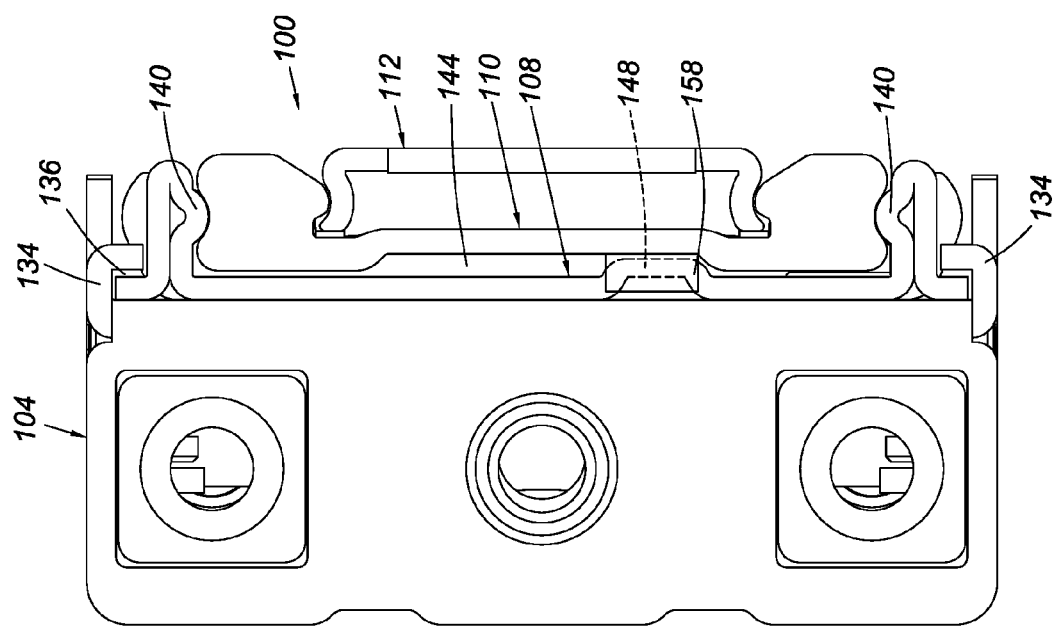
FIG. 4 is a schematic view illustrating the orientation among the components of the slide rail assembly according to the first embodiment of the present invention.

FIG. 4 shows the supporting relationships of the slide rail assembly 100. The bracketing parts 134 of the first bracket 104 facing the accessory channel 136 can bracket the supporting member 108 and therefore provide the supporting member 108 with support, while the supporting portions 140 of the supporting member 108 facing the supporting channel 144 can provide the second rail 110 with support, wherein the second feature 158 of the second rail 110 is situated anterior to the contact feature 148 of the supporting members 108.

FIGS. 5, 5A, and 6 illustrate that when the second rail 110 is pulled out from inside the rack 162 to outside the rack 162, if there is sufficient frictional contact force between the second rail 110 and the pair of supporting portions 140 of the supporting member 108, the supporting member 108 may be driven by the second rail 108 through the frictional force such that the supporting member 108 can move from a first position P1 to a second position P2 relative to the first rail 102 or the first bracket 104. If the frictional force is not sufficient to move the supporting member 108 to the second position P2, the supporting member 108 also can be manually moved from the first position P1 to the second position P2 relative to the first rail 102 or the first bracket 104. Or as shown in FIG. 7, with the aid of the first feature 156 of the second rail 110 being situated posterior to the contact feature 148 of the supporting member 108, the contact feature 148 of the supporting member 108 can be propped by the first feature 156 of the second rail 110 such that the supporting member 108 can move from the first position P1 to the second position P2 relative to the first bracket 104. Based on the aforementioned arrangement, when the second rail 110 is pulled out relative to the first rail 102 to a maximum extended position, the bracketing parts 134 of the first bracket 104 facing the accessory channel 136 can provide the supporting member 108 with support, while the supporting portions 140 of the supporting member 108 facing the supporting channel 144 can provide the second rail 110 with support, and the first sidewalls 114 of the first rail 102 facing the first channel 118 can also provide the second rail 110 with support, thereby enhancing the support for the second rail 110 when it is extended from the first rail 102. It is noted that the first position P1 is located inside the rack 162 and in the vicinity of the first post 164, and that the second position P2 is located outside the rack 162 and in the vicinity of the first post 164 so that the supporting member 108, when being moved to the second position P2, can be in contact with and support the portion of the second rail 110 that extends beyond the rack 162, as shown in FIG. 6 and FIG. 7. This enhances the support strength and ensures that the second rail 110 can be well supported even in an extended state.

FIGS. 8 and 8A illustrate that with the aid of the second feature 158 of the second rail 110 being situated anterior to the contact feature 148 of the supporting member 108, when the second rail 110 is pushed in and thus retracted to a predetermined distance relative to the first rail 102, the contact feature 148 of the supporting member 108 may be propped by the second feature 158 of the second rail 110, such that the supporting member 108 can move back from the second position P2 to the first position P1 relative to the first bracket 104, as shown in FIG. 5.

Figure 9:
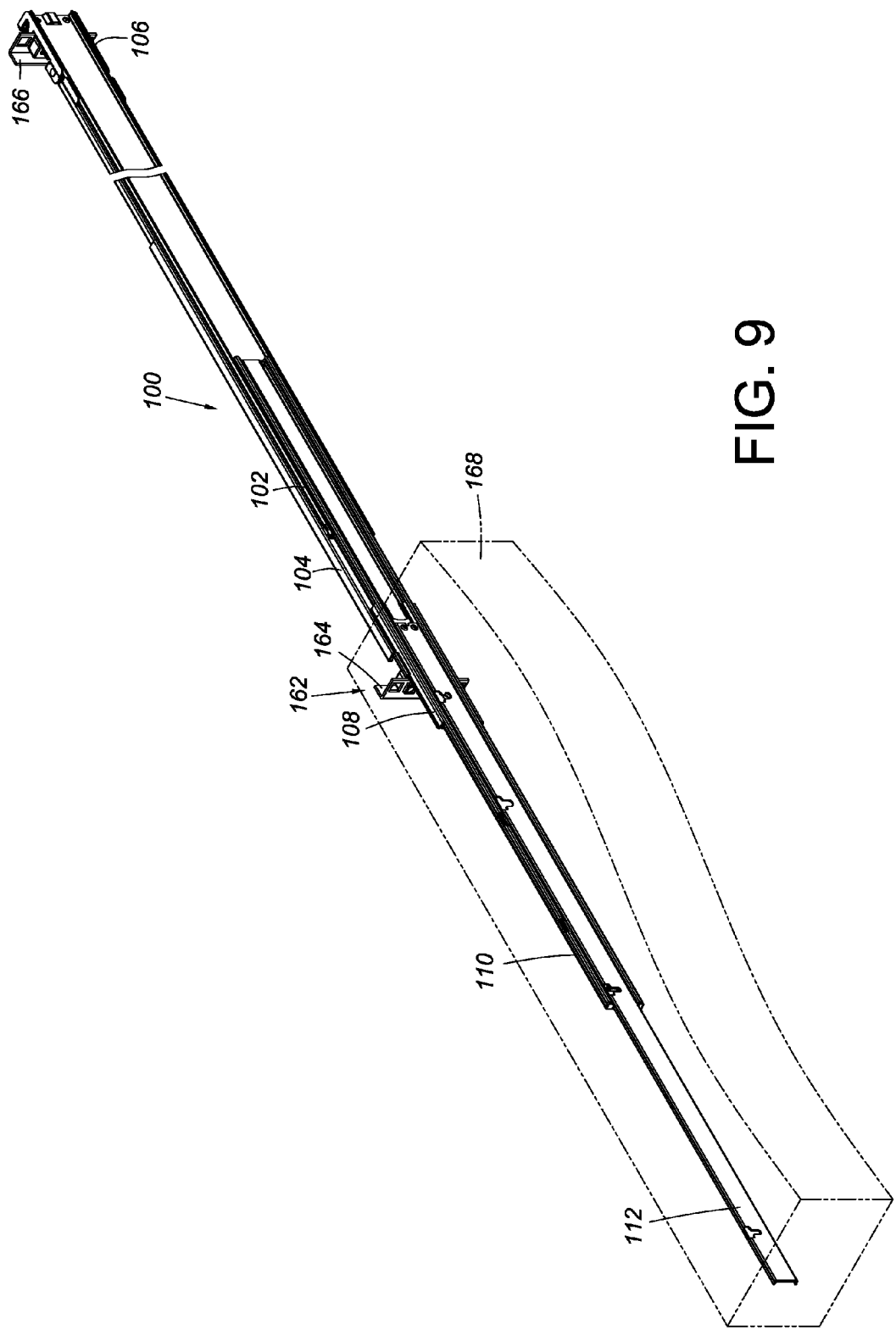
FIG. 9 is a schematic view showing that the slide rail assembly according to the first embodiment of the present invention is mounted with a chassis and pulled out from inside the rack to a fully extended state.

FIG. 9 shows the slide rail assembly 100 mounted on the rack 162 and being pulled out into a fully extended state. When the third rail 112 carries a chassis 168 and the chassis 168 is completely pulled out from inside the rack 162 to outside the rack 162 through the second rail 110, the movement of the supporting member 108 relative to the first bracket 104 can lend additional support for the second rail 110, thereby enhancing the load support capacity of the slide rail assembly 100.

Figure 10:
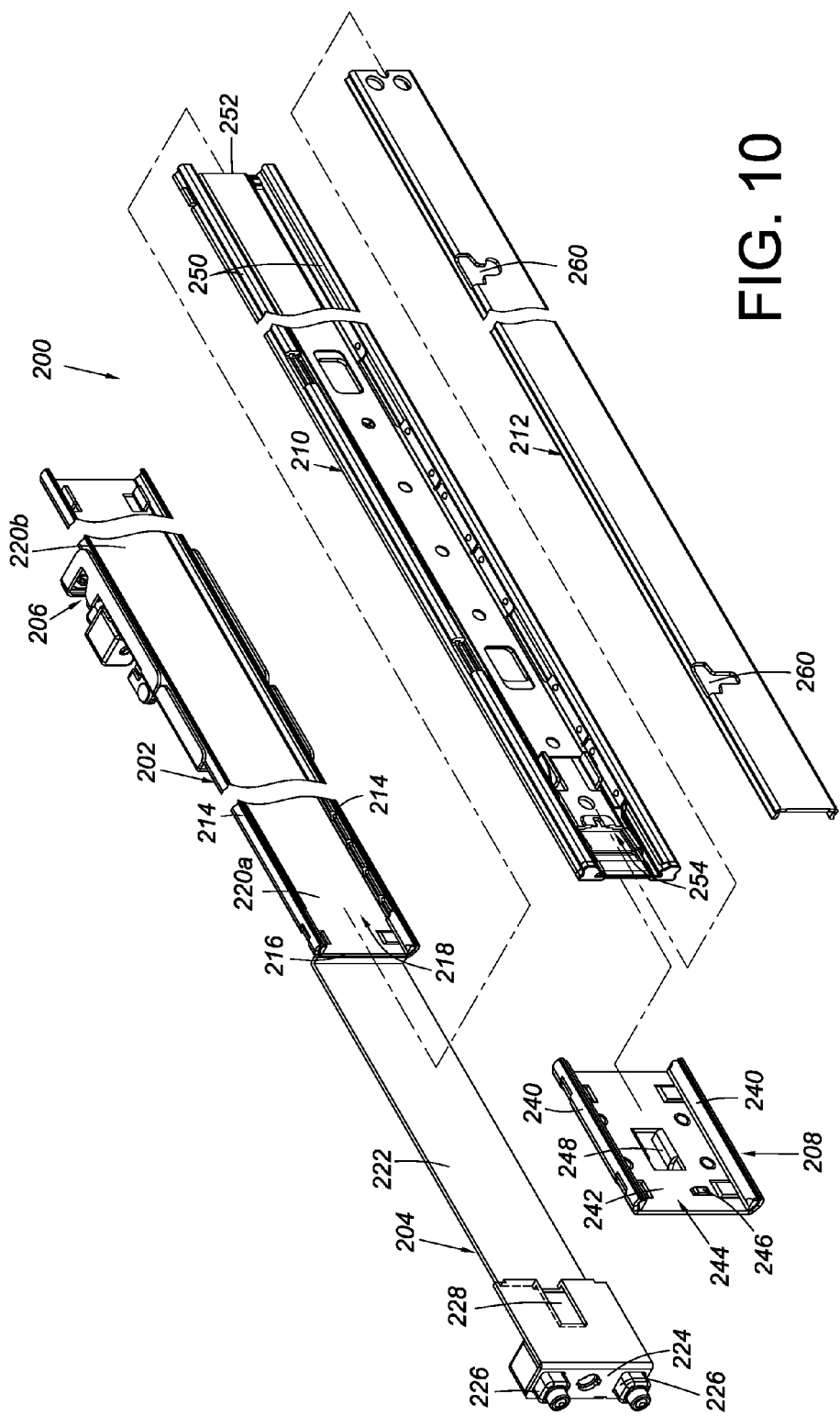
FIG. 10 is an exploded view of a slide rail assembly according to the second embodiment of the present invention.

Reference is made to FIG. 10 which is an exploded view of a slide rail assembly according to the second embodiment of the present invention. The slide rail assembly 200 comprises a first rail 202, a first bracket 204, a second bracket 206, a supporting member 208, a second rail 210, and a third rail 212. The configuration of the first rail 202 is the same as that in the first embodiment, having the features of a pair of first sidewalls 214, a first lateral wall 216, a first channel 218, a front-end portion 220a and a rear-end portion 220b. The first bracket 204 is arranged adjacent to the front-end portion 220a of the first lateral wall 216 of the first rail 202. The first bracket 204 includes a side plate 222, an end plate 224, and a plurality of mounting members 226. The side plate 222 is partially mounted on the first lateral wall 216 of the first rail 202. The part of sidewall 222 adjacent to the end plate 224 is provided with a guiding feature 228, for example, a receiving space having an opening facing the supporting member 208. The second bracket 206 is mounted adjacent to the rear-end portion 220b of the first lateral wall 216 of the first rail 202. The configuration of the supporting member 208 is substantially identical to that in the first embodiment, having the features of a pair of supporting portions 240, a supporting wall 242, a supporting channel 244 and a contact feature 246. In this embodiment, the supporting wall 242 of the supporting member 208 is further provided with a latching feature 248, such as a pair of protruding parts extending from the supporting wall 242. The configuration of the second rail 210 is substantially identical to that described in the first embodiment, comprising a pair of second sidewalls 250, a second lateral wall 252 and a second channel 254. The configuration of the third rail 212 is substantially identical to that described in the first embodiment, including a plurality of mounting features 260 with the configuration of concavity for an object, such as a chassis (not shown in the figure) to be hooked or mounted on the third rail 212.

FIG. 11 illustrates that the supporting member 208 is mounted with the second rail 210 and the supporting channel 244 of the supporting member 208 is provided for the second rail 210 to pass into.

Figure 12B:
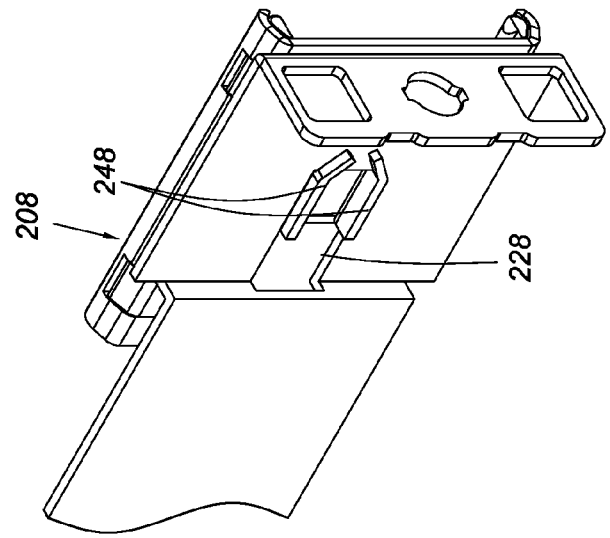
FIG. 12B is a schematic view of the slide assembly according to the second embodiment of the present invention, illustrating that the supporting member is mounted to the first bracket.
Figure 12A:
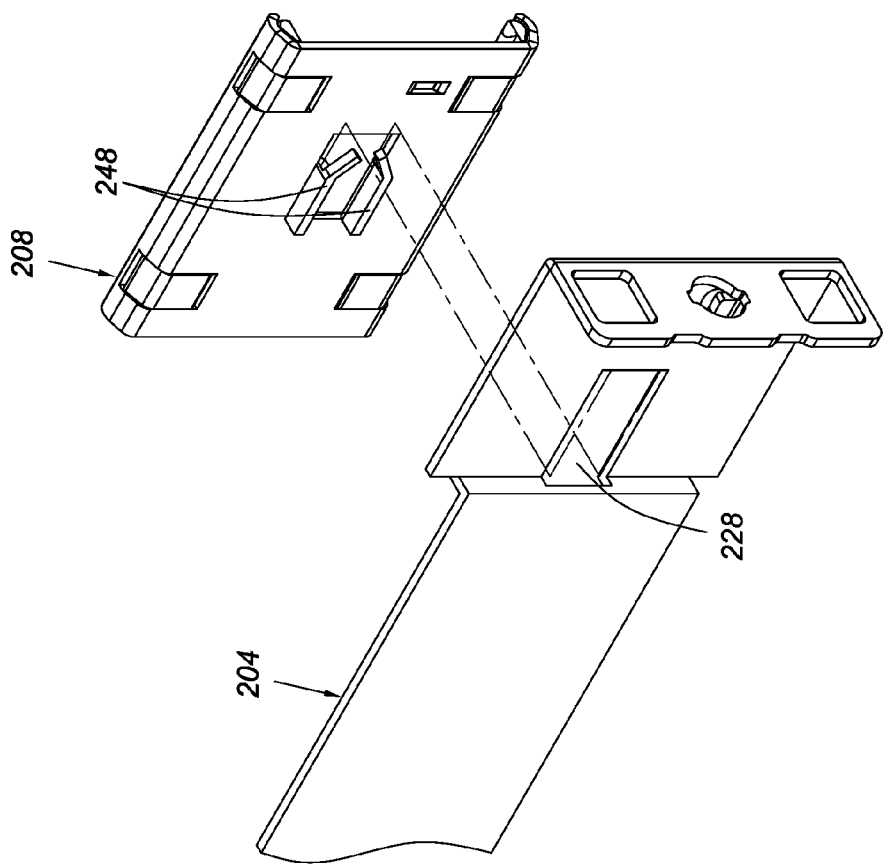
FIG. 12A is an exploded view of the slide rail assembly according to the second embodiment of the present invention, illustrating that the supporting member is not yet mounted on the first bracket.

FIGS. 12A and 12B illustrate that the latching feature 248 of the supporting member 208 can move into the guiding feature 228 of the first bracket 204 and be positioned therein temporarily.

FIG. 13 illustrates that the slide rail assembly 200 is mounted on a rack 262, with the first bracket 204 mounted on a first post 264 of the first rack 262 and the second bracket 206 mounted on a second post 266 of the rack 262. When the slide rail assembly 200 is in retracted state, the second rail 210 is received in the supporting channel 244 of the supporting member 208 and the first channel 218 of the first rail 202. The second rail 210 also has a first feature 256 and a second feature 258 as described in the first embodiment. As shown in FIG. 13A, the second feature 258 is situated anterior to the contact feature 246.

FIGS. 13-15 illustrate that when the second rail 210 is pulled out from inside the rack 262 to outside the rack 262, the supporting member 208 can be driven by the second rail 210 such that the supporting member 208 can move from a first position P1 to a second position P2 relative to the first rail 202 or the first bracket 204, and the latching feature 248 of the supporting member 208 can reach into the guiding feature 228 of the first bracket 204 and be positioned therein temporarily. Based on the aforementioned arrangement, when the second rail 210 is pulled out relative to the first rail 202 to a maximum extended position, the guiding feature 228 of the first bracket 204 can provide the supporting member 208 with support, while the supporting portions 240 of the supporting member 208 facing the supporting channel 244 can provide the second rail 110 with support, and the first sidewalls 214 of the first rail 202 facing the first channel 218 can also provide the second rail 210 with support, thereby enhancing the support for the second rail 210 when it is extended from the first rail 202.

FIG. 16 illustrates that with the aid of the second feature 258 of the second rail 210 being situated anterior to the contact feature 246 of the supporting member 208, when the second rail 210 is pushed in and thus retracted to a predetermined distance relative to the first rail 202, the contact feature 246 of the supporting member 208 may be propped by the second feature 258 of the second rail 210, such that as shown in FIG. 16A, the supporting member 208 can move back from the second position P2 to the first position P1 relative to the first bracket 204.

Although the invention has been explained in relation to its preferred embodiments as mentioned above, they should not be construed as a limitation on the actual applicable scope of the invention, and as such, all modifications and alterations without departing from the spirits of the invention shall remain within the protected scope and claims of the invention.

The invention claimed is:

1. A slide rail assembly, comprising:
a first rail defining a first channel;
a supporting member including a pair of supporting portions and a supporting wall connected between the pair of supporting portions, the pair of supporting portions and the supporting wall jointly defining a supporting channel;
a second rail movably coupled to the first rail and corresponding to the first channel of the first rail and the supporting channel of the supporting member, wherein the supporting member is movable relative to the first rail from a first position to a second position, such that the second rail is supported by the supporting portions of the supporting member when moving relative to the first rail; and
a first bracket mounted on the first rail at a position adjacent to a front-end portion of the first rail, wherein the first bracket includes a side plate, an end plate substantially perpendicularly connected to the side plate, and a plurality of mounting members provided on the end plate; the side plate has a first plate section, a second plate section, and a third plate section extending between the first plate section and the second plate section; the first plate section of the side plate is mounted on the first rail, and the second plate section of the side plate is adjacent to the end plate and provided with a pair of bracketing parts that jointly define an accessory channel, the accessory channel corresponding to the first channel of the first rail via the third plate section.

2. The slide rail assembly of claim 1, wherein the third plate section of the side plate is provided with an elongated hole where at least one connecting member partially passes through the elongated hole to connect to the supporting member such that the supporting member is movable relative to the first bracket.

3. The slide rail assembly of claim 1, wherein the supporting wall of the supporting member has a contact feature; the second rail has a first feature and a second feature; the first feature of the second rail is situated posterior to the contact feature of the supporting member, and the second feature is situated anterior to the contact feature of the supporting member such that when being pulled out or pushed in over a predetermined distance relative to the first rail, the second rail is able to drive the supporting member to move.

4. The slide rail assembly of claim 1, wherein the supporting wall of the supporting member has a latching feature, and the first bracket has a guiding feature for the latching feature to move into it and be positioned therein temporarily.

5. A slide rail assembly, comprising:
a first rail including a pair of first sidewalls and a first lateral wall connected between the pair of first sidewalls, the pair of first sidewalls and the first lateral wall jointly defining a first channel, wherein the first lateral wall has a front-end portion and a rear-end portion opposing the front-end portion;
a first bracket mounted on the first rail at a position adjacent to the front-end portion of the first lateral wall of the first rail, the first bracket including a side plate, an end plate, and a plurality of mounting members, the end plate being substantially perpendicularly connected to the side plate, the plurality of mounting members being provided on the end plate, the side plate having a first plate section, a second plate section, and a third plate section extending between the first plate section and the second plate section, the first plate section being mounted on the first rail, the second plate section being disposed adjacent to the end plate and being provided with a pair of bracketing parts, the pair of bracketing parts jointly defining an accessory channel that corresponds to the first channel of the first rail via the third plate section;
a second bracket mounted on the first rail at a position adjacent to the rear-end portion of the first lateral wall of the first rail;
a supporting member including a pair of supporting portions and a supporting wall connected between the pair of supporting portions, the pair of supporting portions and the supporting wall jointly defining a supporting channel; and
a second rail movably coupled to the first rail and corresponding to the first channel of the first rail and the supporting channel of the supporting member, wherein the supporting member is movable relative to the first bracket from a first position to a second position, such that the second rail is supported by the supporting portions of the supporting member when moving relative to the first rail.

6. The slide rail assembly of claim 5, wherein the third plate section of the side plate is provided with an elongated hole where at least one connecting member partially passes through the elongated hole to connect to the supporting member such that the supporting member is movable relative to the first bracket.

7. The slide rail assembly of claim 5, wherein the supporting wall of the supporting member has a contact feature; the second rail has a first feature and a second feature; the first feature of the second rail is situated posterior to the contact feature of the supporting member, and the second feature of the second rail is situated anterior to the contact feature of the supporting member such that when being pulled out or pushed in over a predetermined distance relative to the first rail, the second rail is able to drive the supporting member to move.

8. The slide rail assembly of claim 5, wherein the supporting wall of the supporting member has a latching feature and the first bracket has a guiding feature for the latching feature to move into it and be positioned therein temporarily.

9. A slide rail assembly adapted for installing a chassis on a rack, the rack including a first post and a second post, the slide rail assembly comprising:
a first rail defining a first channel;
a supporting member including a pair of supporting portions;
a second rail movably coupled to the first rail and corresponding to the first channel of the first rail;
a third rail movably coupled to the second rail and carrying the chassis,
wherein when the chassis is pulled out from inside the rack to outside the rack, the second rail is driven by the third rail and moves, and the supporting member moves relative to the first rail from a first position to a second position, and the supporting portions of the supporting member provide the second rail with support; and
a first bracket mounted to the first rail at a position adjacent to a front-end portion of the first rail, the first bracket including a side plate, an end plate substantially perpendicularly connected to the side plate, and a plurality of mounting members disposed on the end plate, the side plate including a first plate section a second plate section, and a third plate section extending between the first plate section and the second plate section, the first plate section being mounted on the first rail, and the second plate section being adjacent to the end plate and provided with a pair of bracketing parts that jointly define an accessory channel, the accessory channel corresponding to the first channel of the first rail via the third plate section.

10. The slide rail assembly of claim 9, wherein the third plate section of the side plate is provided with an elongated hole where at least one connecting member partially passes through the elongated hole to connect to the supporting member such that the supporting member is movable relative to the first bracket.

11. The slide rail assembly of claim 9, wherein the supporting member includes a supporting wall, in which the supporting wall has a contact feature; the second rail has a first feature and a second feature; the first feature of the second rail is situated posterior to the contact feature of the supporting member and the second feature of the second rail is situated anterior to the contact feature of the supporting member such that when being pulled out or pushed in over a predetermined distance relative to the first rail, the second rail is able to drive the supporting member to move.

12. The slide rail assembly of claim 9, wherein the supporting member includes a supporting wall, in which the supporting wall has a latching feature and the first bracket has a guiding feature for the latching feature to move into it and positioned therein temporarily.

13. The slide rail assembly of claim 9, wherein the first position is located inside the rack and in a vicinity of the first post, and the second position is located outside the rack and also in the vicinity of the first post.

14. A slide rail assembly, comprising:
a first rail defining a first channel;
a supporting member including a pair of supporting portions and a supporting wall connected between the pair of supporting portions, the pair of supporting portions and the supporting wall jointly defining a supporting channel, the supporting wall having a contact feature; and
a second rail movably coupled to the first rail and corresponding to the first channel of the first rail and the supporting channel of the supporting member, wherein the supporting member is movable relative to the first rail from a first position to a second position, such that the second rail is supported by the supporting portions of the supporting member when moving relative to the first rail, the second rail having a first feature and a second feature, the first feature being situated posterior to the contact feature of the supporting member, and the second feature being situated anterior to the contact feature of the supporting member such that when being pulled out or pushed in over a predetermined distance relative to the first rail, the second rail is able to drive the supporting member to move.

15. A slide rail assembly adapted for installing a chassis on a rack, the rack including a first post and a second post, the slide rail assembly comprising:
a first rail defining a first channel;
a supporting member including a pair of supporting portions, the supporting member including a supporting wall, in which the supporting wall has a contact feature;
a second rail movably coupled to the first rail and corresponding to the first channel of the first rail, the second rail has a first feature and a second feature; the first feature of the second rail being situated posterior to the contact feature and the second feature of the second rail is situated anterior to the contact feature such that when being pulled out or pushed in over a predetermined distance relative to the first rail, the second rail is able to drive the supporting member to move; and
a third rail movably coupled to the second rail and carrying the chassis,
wherein when the chassis is pulled out from inside the rack to outside the rack, the second rail is driven by the third rail and moves, and the supporting member moves relative to the first rail from a first position to a second position, and the supporting portions of the supporting member provide the second rail with support.

* * * * *